(12) United States Patent
Fan

(10) Patent No.: US 7,776,649 B1
(45) Date of Patent: Aug. 17, 2010

(54) METHOD FOR FABRICATING WAFER LEVEL CHIP SCALE PACKAGES

(75) Inventor: Wen-Jeng Fan, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 0 days.

(21) Appl. No.: 12/434,126

(22) Filed: May 1, 2009

(51) Int. Cl.
*H01L 21/00* (2006.01)
(52) U.S. Cl. .................. 438/106; 438/108; 438/113; 438/462; 438/464; 438/465; 257/E21.001; 257/E21.499; 257/E21.503; 257/E21.511; 257/E21.599; 257/E23.021; 257/E23.065; 257/E23.135; 257/E25.013; 257/E31.127
(58) Field of Classification Search ............ 438/15, 438/106–113, 462–466; 257/E21.001, 499, 257/503, 511, 599, 705, E23.021, 65, 135, 257/E25.013, 31.127
See application file for complete search history.

(56) References Cited

U.S. PATENT DOCUMENTS

| | | | | |
|---|---|---|---|---|
| 5,347,162 A * | 9/1994 | Pasch | ............ | 257/773 |
| 5,946,555 A * | 8/1999 | Crumly et al. | ............ | 438/125 |
| 6,008,070 A * | 12/1999 | Farnworth | ............ | 438/114 |
| 6,075,290 A * | 6/2000 | Schaefer et al. | ............ | 257/737 |
| 6,245,595 B1 * | 6/2001 | Nguyen et al. | ............ | 438/108 |
| 6,352,878 B1 * | 3/2002 | Mostafazadeh et al. | ............ | 438/106 |
| 6,379,982 B1 * | 4/2002 | Ahn et al. | ............ | 438/14 |
| 6,613,606 B1 * | 9/2003 | Lee | ............ | 438/108 |
| 6,649,445 B1 * | 11/2003 | Qi et al. | ............ | 438/108 |
| 6,897,089 B1 * | 5/2005 | Farnworth | ............ | 438/106 |
| 6,953,708 B2 * | 10/2005 | Hedler et al. | ............ | 438/110 |
| 7,002,245 B2 * | 2/2006 | Huang et al. | ............ | 257/701 |
| 7,105,424 B2 * | 9/2006 | Tsai et al. | ............ | 438/464 |
| 7,115,484 B2 * | 10/2006 | Feng | ............ | 438/460 |
| 7,144,800 B2 * | 12/2006 | Mostafazadeh et al. | ............ | 438/598 |
| 7,170,153 B2 * | 1/2007 | Saga | ............ | 257/678 |
| 7,202,107 B2 * | 4/2007 | Fuergut et al. | ............ | 438/112 |
| 7,262,622 B2 * | 8/2007 | Zhao | ............ | 324/763 |
| 7,648,911 B2 * | 1/2010 | Pagaila et al. | ............ | 438/667 |
| 2007/0155047 A1 * | 7/2007 | Jayaraman et al. | ............ | 438/106 |
| 2009/0108472 A1 * | 4/2009 | Feger et al. | ............ | 257/782 |
| 2010/0003786 A1 * | 1/2010 | Feger et al. | ............ | 438/113 |

* cited by examiner

*Primary Examiner*—Michael S Lebentritt
(74) *Attorney, Agent, or Firm*—Muncy, Geissler, Olds & Lowe, PLLC

(57) ABSTRACT

A method for fabricating a plurality of wafer level chip scale packages is revealed. A bumped wafer is laminated with a mold plate with a protection film placed thereon to partially embed the bumps of the wafer into the protection film and to form an underfill gap between the wafer and the protection film. By a first sawing step, the wafer fixed by the protection film is singulated into a plurality of chips having sides between the active surface and the back surface and also a filling gap is formed between the sides. Then, an encapsulant is formed on the protection film where the encapsulant fills the underfill gap through the filling gap to completely encapsulate the chips and the non-embedded portions of the bumps. By separating the encapsulant from the protection film and a second sawing step, the mold plate and the protection film are removed, and the encapsulant is singulated into a plurality of individual wafer level chip scale packages.

12 Claims, 6 Drawing Sheets

METHOD FOR FABRICATING WAFER LEVEL CHIP SCALE PACKAGES

FIELD OF THE INVENTION

The present invention relates to semiconductor devices, and more particularly to methods for fabricating a plurality of wafer level chip scale packages (WLCSP).

BACKGROUND OF THE INVENTION

In conventional semiconductor packages, chips are disposed on larger substrates where the internal electrical connections between chips and substrates can be divided into two major methodologies, flip-chip bonding and wire bonding. For flip-chip bonding, bumps are pre-disposed on chips then flipped and joined the bumped chips on substrates to achieve electrical connections through bumps. Normally, semiconductor packages will be surface-mounted on external printed circuit boards as electronic components, and therefore, substrates are served as external electrical interposers. Moreover, since the dimensions of substrates are larger than the ones of chips, therefore, semiconductor packages can not meet the specifications of wafer level chip scale packages.

As shown in FIG. 1, a conventional flip-chip package 100 comprises a chip 110, a plurality of bumps 120, an underfill material 130, a substrate 140, and a plurality of solder balls 150. The chip 110 has an active surface 111, a corresponding back surface 112, a plurality of sides 113, and a plurality of bonding pads 114 disposed on the active surface 111. The bumps 120 are disposed on the bonding pads 114. The chip 110 is electrically and mechanically connected to the substrate 140 by the bumps 120 by flip chip bonding. The underfill material 130 is disposed between the chip 110 and the substrate 140 to encapsulate the bumps 120. Therefore, the chip 110 in the flip-chip package 100 can be electrically connected to an external printed circuit board through the substrate 140 and the solder balls 150 disposed on the bottom surface of the substrate 140. Normally, the underfill material 130 is used to protect and hold the bumps 120. However, the portions of the chip 110 that are not encapsulated by the underfill material 130 include the back surface 112 and parts of the sides 113 which are easily penetrated by the moisture leading to failure. Furthermore, since the thermal expansion coefficients (CTE) of the chip 110 and of the substrate 140 are different, warpage will be induced in the substrate 140 due to CTE mismatching. Moreover, the substrate warpage will get even worse when the dimension differences between the substrate 140 and the chip 110 become larger leading to package reliability issues.

The dimension of a wafer level chip scale package (WLCSP) is close to or equal to the dimension of a chip inside where WLCSP are packaged under wafer forms without any larger substrate.

A conventional wafer level chip scale package excluding substrates is revealed. Even though no substrate is needed, however, an encapsulant for protecting the chip is disposed on the back surface and four sides of the chip without covering the active surface of the chip, therefore, moisture will penetrate through the exposed active surface. Moreover, due to curing of encapsulant or mismatching of CTE, the external stresses exerted on the active surface of a chip are different from the ones exerted on the back surface of a chip leading to chip warpage or even chip crack. Furthermore, the external conductive bumps are completely exposed from the encapsulant without protecting by the encapsulant, therefore, the external conductive bumps will easily be broken or deformed due to external stresses as well as easily be affected by the moisture leading to degradation of electrical performance.

SUMMARY OF THE INVENTION

The main purpose of the present invention is to provide a method for fabricating wafer level chip scale packages to eliminate substrates and to fully protect chips to avoid mechanical damages or moisture penetration and to further avoid chip warpage due to CTE mismatching between the chip and the encapsulant.

The second purpose of the present invention is to provide a method for fabricating wafer level chip scale packages to provide good stress distributions to avoid broken bumps and to prevent bump deformation under temperature changing environments.

According to the present invention, a method for fabricating wafer level chip scale packages is revealed. Firstly, a wafer is provided, including a plurality of chips integrally connected together and having an active surface, a back surface, a plurality of bonding pads disposed on the active surface and a plurality of bumps disposed on the bonding pads. Secondly, the wafer is laminated to a mold plate with a protection film placed on the mold plate so that the bumps are partially embedded into the protection film and an underfill gap is formed between the wafer and the protection film. Then, in a first sawing process, the wafer is singulated into the chips where each chip has a plurality of sides between the active surface and the back surface and a filling gap is formed between the sides. Then, an encapsulant is formed on the protection film on the mold plate, where the encapsulant completely encapsulates the chips and the non-embedded portions of the bumps by filling the underfill gap through the filling gap. Then, the encapsulant is separated from the protection film, where the embedded portions of the bumps are exposed and extruded from a bottom surface of the encapsulant. Finally, in a second sawing process, the encapsulant is singulated into the plurality of individual WLCSPs where the active surface, the back surface and the sides are still encapsulated.

The method for fabricating a plurality of wafer level chip scale packages according to the present invention has the following advantages and functions:

1. Through the disposition of a protection film on the mold plate for firmly holding the wafer with bumps by lamination and followed by wafer singulation and encapsulation processes, a substrate in a WLCSP can be eliminated to completely encapsulant the chip with bumps partially exposed. The chip is fully protected to avoid mechanical damage or moisture penetration and to further prevent chip warpage due to CTE mismatching between the chip and the encapsulant.

2. Through the disposition of a protection film on the mold plate and formations of the underfill gap and the filling gap, the encapsulant can completely encapsulate the chip with the bumps partially embedded in the protection film. The embedded portions of the bumps become exposed terminals extruded from the encapsulant to provide excellent stress distributions to avoid broken bumps and to prevent bump deformation under temperature cycling environments.

3. Through the sequences of laminating the wafer to the mold plate, singulating the wafer, forming encapsulant, and singulating the encapsulant, an innovative wafer level packaging is provided to complete encapsulating the chip and to eliminate the conventional substrates and underfill.

4. Through the formation of the underfill gap between the wafer and the protection film on the mold plate by the lamination step and the wafer singulation to chips performed before encapsulation, the encapsulant will completely encapsulate the chips during encapsulation to avoid wafer warpage issues caused by the stresses due to curing of the encapsulant.

DETAILED DESCRIPTION OF THE INVENTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

Figure 1:
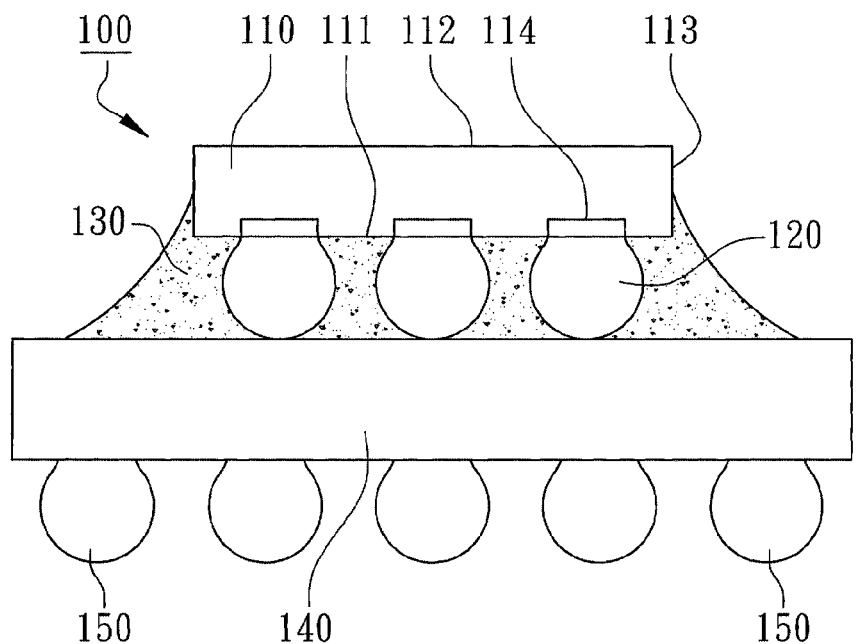
FIG. 1 is a cross-sectional view of a conventional flip-chip wafer level chip scale package.
Figure 2:
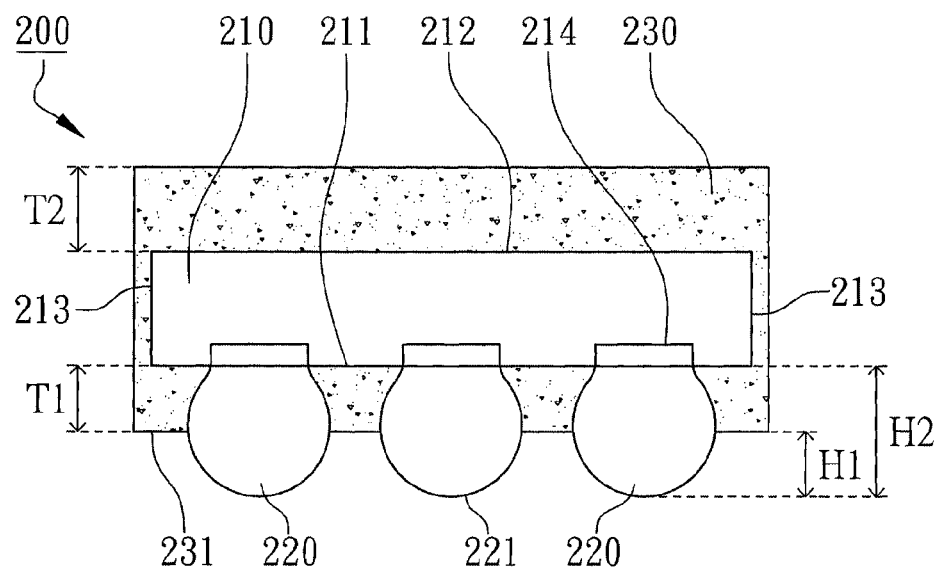
FIG. 2 is a cross-sectional view of a wafer level chip scale package according to the first embodiment of the present invention.

According to the first embodiment of the present invention, a wafer level chip scale package is illustrated in FIG. 2 for a cross-sectional view. The wafer level chip scale package 200 primarily comprises a chip 210, a plurality of bumps 220, and an encapsulant 230. The chip 210 has an active surface 211, a back surface 212, and a plurality of sides 213 between the active surface 211 and the back surface 212. Normally, the shapes of the chip 210 are either rectangular or square having four sides 213 formed by wafer singulation. The major material of the chip 210 is semiconductor such as Silicon. The active surface 211 is the surface on which ICs or active components are fabricated. After fabrication of ICs or components, a passivation layer is disposed on the active surface 211 for protection and for insulation. As shown in FIG. 2, a plurality of bonding pads 214 are disposed on the active surface 211 where the bonding pads 214 are disposed in an array, in peripheries, or in a single row or in multiple rows at the center of a chip where an array is preferred. The materials of the bonding pads 214 can be copper or aluminum. A metal layer such as gold, titanium, tungsten, copper, or other alloys is disposed on the bonding pads 214 to enhance the bonding strengths between the bonding pads 214 and the bumps 220. In this embodiment, each wafer level chip scale package 200 only includes one of the encapsulated chips 210.

As shown in FIG. 2, the bumps 220 are disposed on the bonding pads 214 as external input/output electrodes of the chip 210. In actual devices, the wafer level chip scale packages 200 are configured for surface mounting on an external printed circuit board (not shown in the figures), through the bonding of the bumps 220. In the present embodiment, the bumps 220 can be spherical solder bumps to directly bond on an external printed circuit board by reflowing processes to eliminate substrates as the conventional semiconductor packages. The bumps 220 can be formed by electroplating or by printing where the materials of the bumps 220 can be tin-lead or lead-free solder comprising copper, silver, nickel, gold, platinum, palladium, etc.

As shown in FIG. 2 again, the encapsulant 230 encapsulates the active surface 211, the back surface 212, and the sides 213 of the chip 210 to achieve complete encapsulation for the chip 210, i.e., the chip 210 is completely encapsulated by the encapsulant 230 with complete protection. In the present embodiment, the thickness T1 of the encapsulant 230 covering the active surface 211 can not be smaller than half of the thickness T2 of the encapsulant 230 covering the back surface 212 to balance the thermal stresses exerted on the active surface 211 and the back surface 212 of the chip 210. The thickness of the encapsulant 230 covering the sides 213 can be smaller than the thickness T1 on the active surface 211. As shown in FIG. 2 again, the encapsulant 230 not only completely encapsulates the chip 210, but also partially embedded the bumps 220 to make the bumps partially exposed and extruded from the bottom surface 231 of the encapsulant 230. Since the encapsulant 230 fixes the encapsulated portions of the bumps 220, it can avoid breakage at the bonding interfaces between the bumps 220 and the bonding pads 214 of the chip 210 to affect the quality of electrical connection. In the present embodiment, the extruded height H1 of the bumps 220 from the encapsulant 230 ranges between one third and two third of the bumps height H2 of the bumps 220 from the active surface 211 for easily external bonding. In this embodiment, the extruded exposed surfaces 221 of the bumps 220 are hemispherical. The materials of the encapsulant 230 comprise epoxy to become thermosetting. To be more specific, the encapsulant 230 can be molding compound. The encapsulant 230 can firmly hold the bumps 220 to avoid bump shifting during reflow processes and to further eliminate the conventional underfilling processes or reduce the amount of underfill materials used. The dimension of the encapsulant 230 is designed to meet the dimension of a wafer level chip scale package, i.e., the dimension of the wafer level chip scale package 200 is approximately equal to or not greater than 1.5 times of the dimension of the chip 210. Therefore, the wafer level chip scale package 200 has a smaller footprint suitable for electronic products with the characteristics of lighter, thinner, smaller, and lower profiles.

Therefore, as described above, through the fully encapsulation of the chips 210 and the partially embedding of the bumps 220 by the encapsulant 230, the conventional substrate can be eliminated where the chip 210 are completely encapsulated with the bumps 220 partially exposed so that the chip 210 is well protected by the encapsulant 230 to avoid chipping, cracks, mechanical damages, or moisture penetration as well as chip warpage caused by CTE mismatching between the chip 210 and the encapsulant 230. Moreover, the bumps 220 are partially embedded in the encapsulant 230 having extruded portions partially exposed from the encapsulant 230 so that the encapsulant 230 can provide excellent stress distributions to avoid broken bumps and to prevent bump deformation under temperature changing environments.

A manufacturing method of the described wafer level chip scale package is also revealed in the present invention as shown from FIG. 3A to FIG. 3G for the cross-section views of the components during manufacturing processes.

Figure 3A:
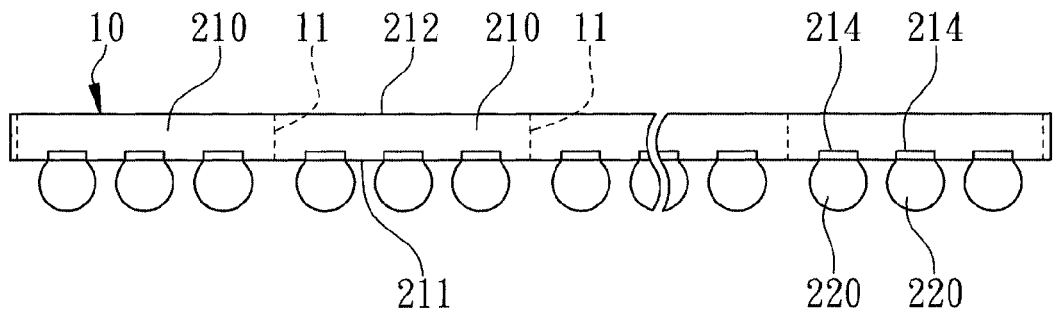
FIGS. 3A to 3G are cross-sectional views of components during the processes for fabricating a plurality of wafer level chip scale packages according to the first embodiment of the present invention.

As shown in FIG. 3A, a first step is to provide a wafer 10, where the wafer 10 comprises the plurality of chips 210 described above. The chips 210 are integrally connected to each other. Each chip 210 has the plurality of bonding pads 214 disposed on the active surface 211, and the bumps 220 are disposed on the bonding pads 214. The wafer 10 also has a plurality of scribe lines 11 in X-axis and in Y-axis which are perpendicular to each other to define the shapes and dimensions of the chips 210.

Figure 3B:
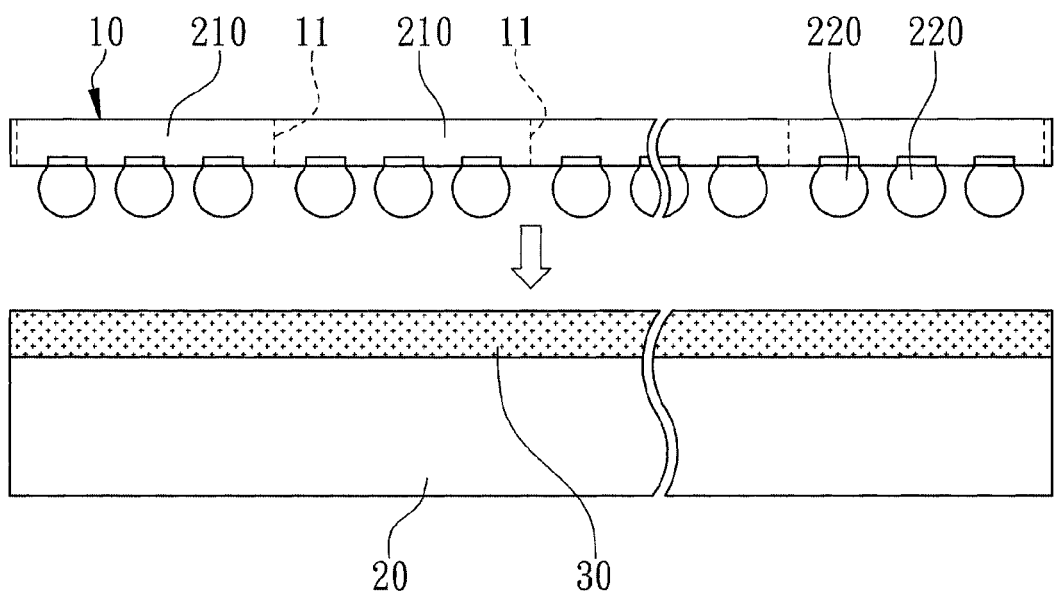
Figure 3C:
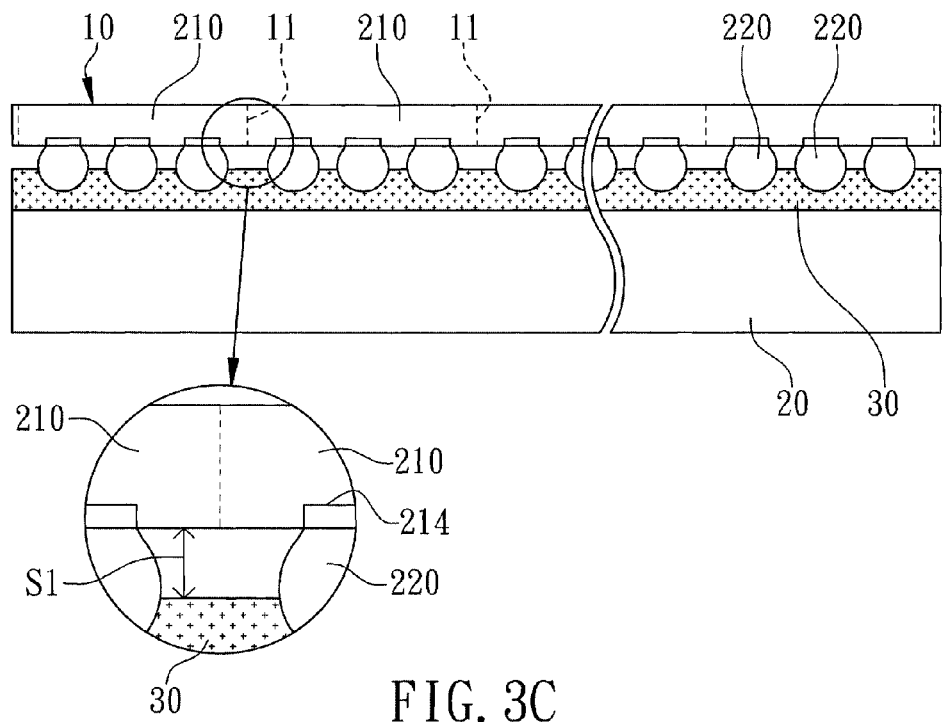

As shown in FIG. 3B and FIG. 3C, a second step is to laminate the wafer 10 to a mold plate 20, where the active surface of the wafer 10 with the bumps 220 facing to the mold plate 20 is laminated to the mold plate 20. As shown in FIG. 3B and FIG. 3C, before lamination, a protection film 30 is placed on the mold plate 20. By lamination under a specific pressure, the bumps 220 are partially embedded into the protection film 30 and an underfill gap S1 (as shown in the partially enlarged view in FIG. 3C) is formed between the wafer 10 and the protection film 30 to define the encapsulation thickness of the encapsulant 230 on the active surface 211. The protection film 30 is capable of providing a temporary adhesion to the bumps 220. Accordingly, the major function of the protection film 30 is to firmly hold the wafer 10, to protect the bumps 220 during singulating the wafer 10 to avoid breaking the bumps 220 due to stresses, and to firmly hold the singulated chips 210 without separation after singulation. Preferably, the protection film 30 can be photo-sensitive adhesive tapes where the adhesion can be reduced or eliminated by radiation of light in the following processes. More preferably, the mold plate 20 is transparent to enhance light radiation of the photo processes through the mold plate 20 to the protection film 30. A sequent step can be performed to release the adhesion of the protection film 30 by radiation through the mold plate 20 before separating the encapsulant 230 from the protection film 30 (from FIG. 3E to FIG. 3F) so that the wafer 10 and the mold plate 20 are not firmly adhered to each other. Since the mold plate 20 is made of rigid materials with certain strengths and stiffness to support the protection film 30 to ensure the parallelism between the wafer 10 and the mold plate 20 so that the underfill gap S1 between the wafer 10 and the protection film 30 can be well controlled.

Figure 3D:
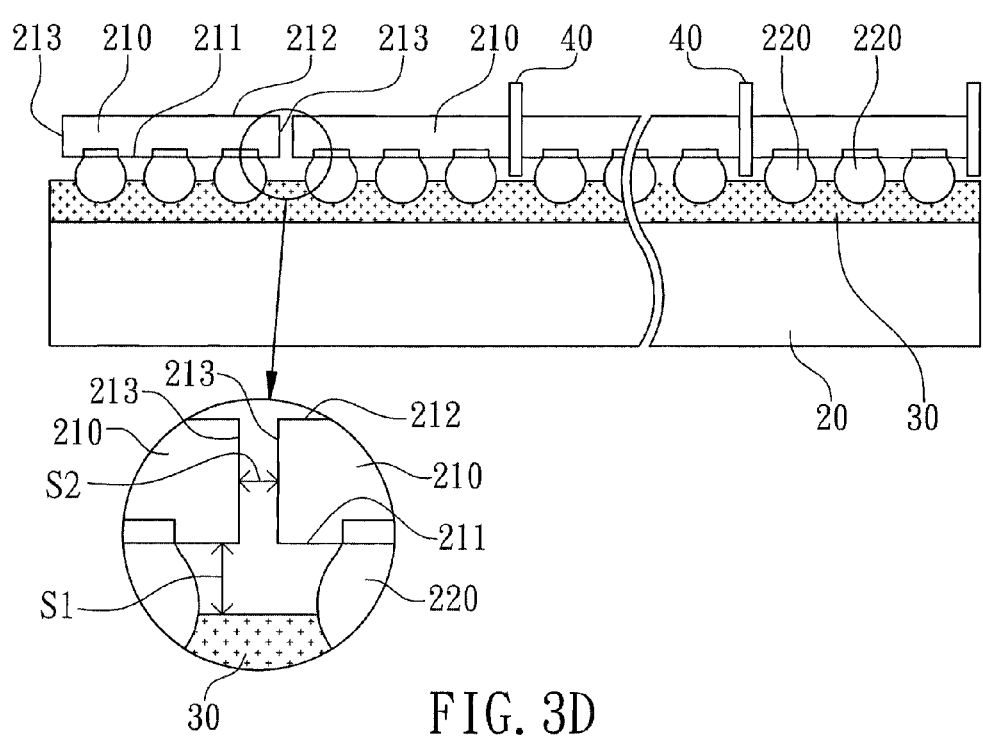

Then, as shown in FIG. 3C and FIG. 3D, the next step is to singulate the wafer 10 to a plurality of individual chip 210 along the scribe lines 11, where each chip 210 has a plurality of sides 213 between the active surface 211 and the back surface 212 and where a filling gap S2 (as shown in the partially enlarged view in FIG. 3D) is formed between the sides 213. In the present embodiment, a sawing tool 40 cut through the wafer 10, without cutting the mold plate 20 and the protection film 30. In a different embodiment, laser can be implemented to singulate the wafer 10. Accordingly, the mold plate 20 can be recycled and reused and the sawing tool 40 is not stained with the protection film 30 during the process of singulating the wafer 10. Especially, during singulating the wafer 10, the underfill gap S1 between the wafer 10 and the protection film 30 can serve as the tolerance for singulating the wafer 10 to ensure that the singulating tool 40 will not touch nor damage the protecting film 30 nor the mold plate 20. As shown in the partially enlarged view in FIG. 3D, the filling gap S2 are formed between the sides 213 of the chips 210 after singulation. In the present embodiment, the filling gap S2 between the sides 213 of the chips 210 is smaller than the underfill gap S1 between the wafer 10 and the protection film 30.

Figure 3E:
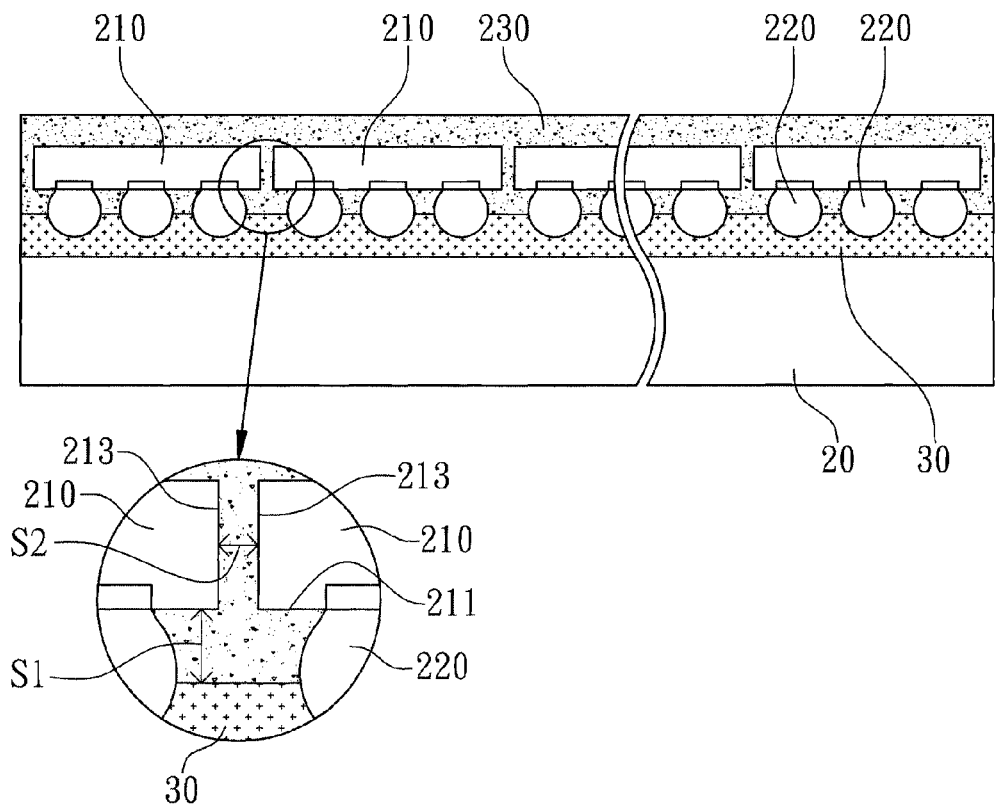

As shown in FIG. 3E, the encapsulant 230 is formed on the protection film 30 on the mold plate 20 by transfer molding, printing, or spin coating. As shown in FIG. 3E with the partially enlarged view, the encapsulant 230 fills the underfill gap S1 through the filling gap S2 to completely encapsulate the chips 210 and the non-embedded portions of the bumps 220 between the protection film 30 and the active surface 211. The encapsulant 230 encapsulates the active surfaces 211, the back surfaces 212, and the sides 213 of the chips 210 to avoid unbalanced stresses during the curing of the encapsulant 230 to reduce warpage of the encapsulant 230. During the formation of the encapsulant 230, the chips 210 have been singulated without connecting to each other, therefore, the stresses due to the curing of the encapsulant 230 can be dispersed without wafer warpage issues.

Figure 3F:
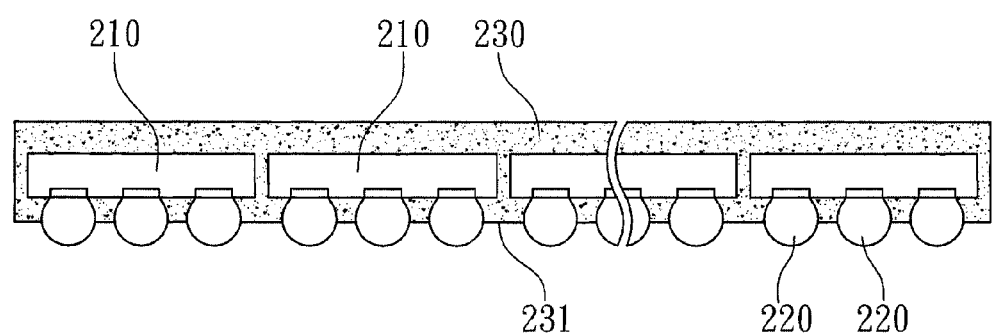

After encapsulation, as shown in FIG. 3E and FIG. 3F, the encapsulant 230 encapsulating the chips 210 is separated from the protection film 30 on the mold plate 20. Additionally, the embedded portions of the bumps 220 in protection film 30 are exposed and extruded from the bottom surface 231 of the encapsulant 230. Preferably, since the protection film 30 is a photo-sensitive adhesive tape, the adhesion of the protection film 30 can be reduced by radiation of light to enhance the peeling and removal of the protection film 30 and to avoid residues of the protection film 30 on the exposed portions of the bumps 220 without affecting the quality of electrical connections. Furthermore, in the described encapsulation processes above, the protection film 30 can be planarized by the mold plate 20 to make the bottom surface 231 of the encapsulant 230 to be a flat surface to avoid arbitrary shapes of the encapsulant 230 and bumpy surfaces on the bottom surface 231 of the encapsulant 230.

Figure 3G:
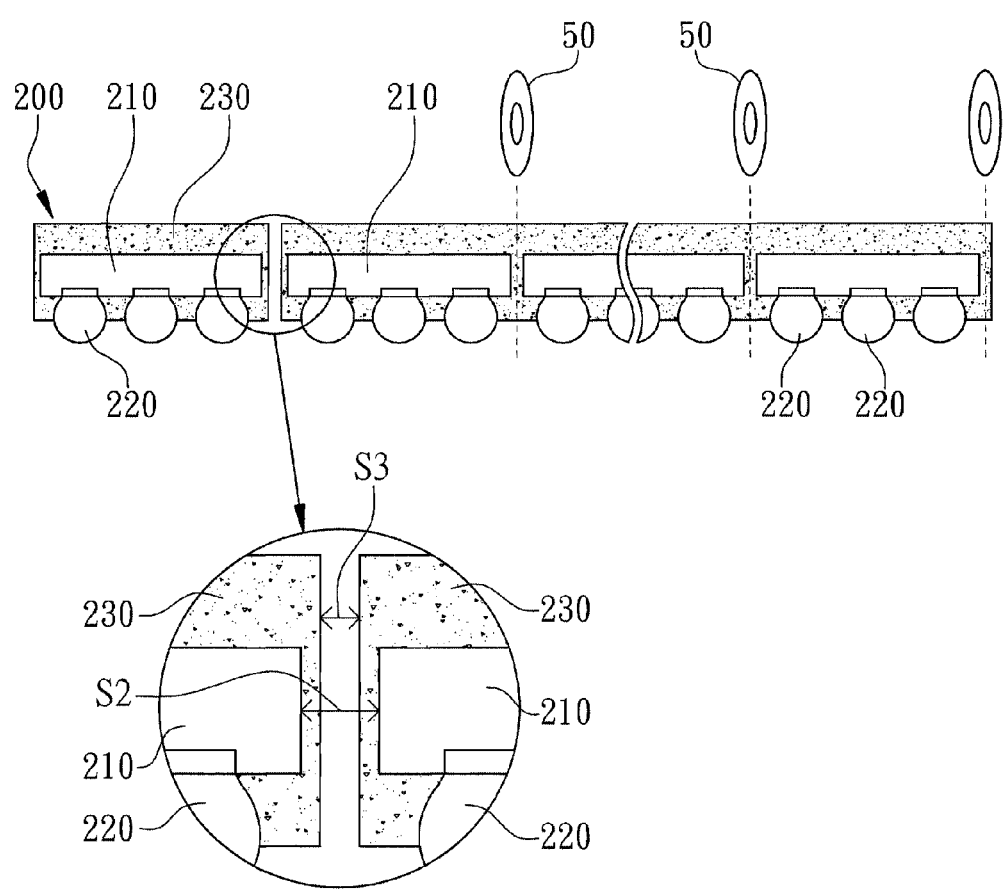

As shown in FIG. 3G, the encapsulant 230 is singulated into a plurality of wafer level chip scale packages 200 by a sawing tool 50 such as mechanical blades or laser. A cutting gap S3 is formed during the singulation processes of encapsulant 230, which is aligned to and smaller than the filling gap S2 between the sides 231 of the chips 210 so that the sides 213 of the chips 210 are still encapsulated by the encapsulant 230 after singulating the encapsulant 230. To be more specific, the cutting width (equal to S3) of the sawing tool 50 during the singulation processes of the encapsulant 230 is smaller than the cutting width (equal to S2) of the singulation tool 40 during the singulation processes of the wafer 10. Therefore, during the singulation processes of the encapsulant 230, the chips 210 are not cut to protect the encapsulated chips 210 from damages.

From the above description, the manufacturing method can provide an innovative wafer level chip scale packages to completely encapsulate the chips for direct external electrical connections without the conventional substrates or underfill processes. The warpage of the chips 210 can be greatly reduced through the singulation of the wafer 10 into the individual chips 210 before the encapsulation processes and through the forming position of the encapsulant 230.

Figure 4:
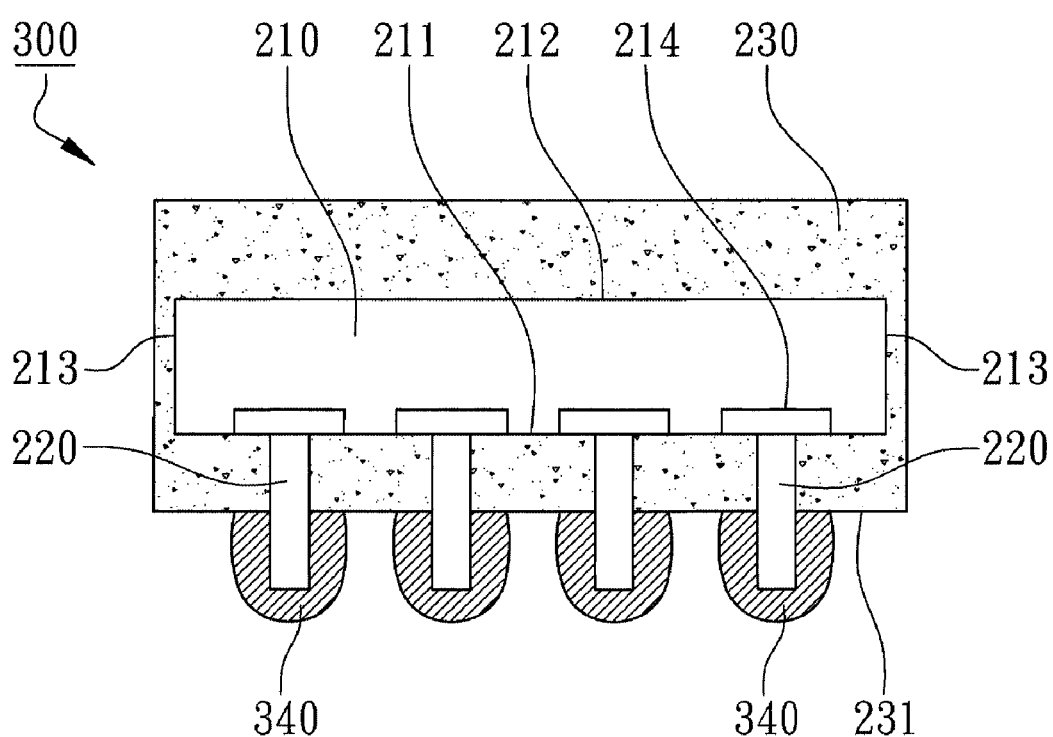
FIG. 4 is a cross-sectional view of a wafer level chip scale package according to the second embodiment of the present invention.

The shapes of the bumps are not limited in the present invention and further descriptions are followed. According to the second embodiment of the present invention, another wafer level chip scale package 300 is illustrated in FIG. 4 for a cross-sectional view. The major components of the wafer level chip scale package 300 are the same as the first embodiment such as the chips 210, the bumps 220, and the encapsulant 230. Therefore, the component numbers will follow the ones as the first embodiment and will not be described again. Additionally, the method for fabricating the wafer level chip scale package 300 is the same as the first embodiment mentioned above. The chip 210 has an active surface 211, a back surface 212, and a plurality of sides 213 between the active surface 211 and the back surface 212 where a plurality of bonding pads 214 are disposed on the active surface 211. The bumps 220 are disposed the bonding pads 214. The encapsulant 230 completely encapsulates the chip 210 and partially embeds the bumps 220, wherein portions of the bumps 220 are exposed and extruded from the bottom surface 231 of the encapsulant 230. In the present embodiment, the bumps 220 can be pillar bumps. Preferably, the materials of the bumps 220 are plated metals with high melting temperatures such as copper. The coplanarity of the wafer level chip scale package 300 for external electrical connections is kept by the bumps 220. In a different embodiment, the materials of the bumps 220 can be gold, copper, aluminum, or other alloys. As shown in FIG. 4, in the present embodiment, the wafer level chip scale package 300 further comprises a plurality of soldering materials 340 on the exposed portions of the bumps 220 extruded from the encapsulant 230 for soldering to an external printed circuit board. Soldering materials 340 include reflowed solder pastes formed by printing or solder layers formed by plating. Therefore, the wafer level chip scale package 300 can eliminate the substrate to achieve the efficacy of fully protecting chip, and even more avoid chip warpage and bump breakage.

Furthermore, the primary manufacturing processes of the wafer level chip scale package 300 are the same as the ones of the first embodiment such as "providing a wafer", "laminating the wafer to a mold plate", "singulating the wafer", "forming an encapsulant on the protection film", "separating the encapsulant from the protection film", and "singulating the encapsulant". Additionally, the manufacturing processes of the wafer level chip scale package 300 further comprises the step of forming soldering materials 340 on the exposed portions of the bumps 220 extruded from the encapsulant 230 after separating the encapsulant 230 from the protection film. Accordingly, the bumps 220 are completely covered by the encapsulant 230 and the soldering materials 340.

The above description of embodiments of this invention is intended to be illustrative but not limited. Other embodiments of this invention will be obvious to those skilled in the art in view of the above disclosure which still will be covered by and within the scope of the present invention even with any modifications, equivalent variations, and adaptations.

What is claimed is:

1. A method for fabricating a plurality of wafer level chip scale packages, comprising the following steps of
    providing a wafer including a plurality of chips integrally connected and having an active surface, a back surface, a plurality of bonding pads disposed on the active surface and a plurality of bumps disposed on the bonding pads;
    laminating the wafer to a mold plate with a protection film placed on the mold plate so that the bumps are partially embedded into the protection film and an underfill gap is formed between the wafer and the protection film;
    singulating the wafer into the chips, where each chip has a plurality of sides formed between the active surface and the back surface and where a filling gap is formed between the sides;
    forming an encapsulant on the protection film on the mold plate, where the encapsulant fills into the underfill gap through the filling gap to completely encapsulate the chips and the non-embedded portions of the bumps;
    separating the encapsulant encapsulating the chips from the protection film on the mold plate, where the embedded portions of the bumps are exposed and extruded from a bottom surface of the encapsulant; and
    singulating the encapsulant into the plurality of individual wafer level chip scale packages, where the active surface, the back surface, and the sides are still encapsulated.

2. The method as claimed in claim 1, wherein each wafer level chip scale package only includes one of the encapsulated chips.

3. The method as claimed in claim 1, wherein the bumps have an extruded height from the encapsulant ranging from one third to two third of the height of the bumps from the active surface after separating the encapsulant from the protection film.

4. The method as claimed in claim 1, wherein the extruded surfaces of the bumps are hemispherical after separating the encapsulant from the protection film.

5. The method as claimed in claim 1, wherein the encapsulant is thermosetting.

6. The method as claimed in claim 1, wherein the mold plate and the protection film are not cut by a sawing tool during the wafer-singulating step.

7. The method as claimed in claim 1, wherein the protection film is capable of providing a temporary adhesion to the bumps.

8. The method as claimed in claim 7, wherein the mold plate is transparent, and further comprising the step of releasing the adhesion of the protection film by radiation through the mold plate before separating the encapsulant from the protection film.

9. The method as claimed in claim 1, wherein the thickness of the encapsulant covering the active surface is not smaller than half of the thickness of the encapsulant covering the back surface during the step of forming the encapsulant.

10. The method as claimed in claim 1, wherein a cutting gap formed by singulating the encapsulant is aligned to and smaller than the filling gap between the sides of the chips so that the sides of the chips are still encapsulated by the encapsulant after the step of singulating the encapsulant.

11. The method as claimed in claim 1, wherein the bumps are pillar bumps.

12. The method as claimed in claim 11, further comprising the step of forming soldering materials on the exposed portions of the bumps extruded from the encapsulant after separating the encapsulant from the protection film.

* * * * *